United States Patent
Tsao et al.

(10) Patent No.: US 7,053,453 B2
(45) Date of Patent: May 30, 2006

(54) SUBSTRATE CONTACT AND METHOD OF FORMING THE SAME

(75) Inventors: Hsun-Chih Tsao, Hsin-Chu (TW); Chien-Chao Huang, Hsin-Chu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 50 days.

(21) Appl. No.: 10/863,600

(22) Filed: Jun. 8, 2004

(65) Prior Publication Data

US 2005/0236712 A1 Oct. 27, 2005

Related U.S. Application Data

(60) Provisional application No. 60/566,187, filed on Apr. 27, 2004.

(51) Int. Cl.
*H01L 29/76* (2006.01)

(52) U.S. Cl. .................. 257/374; 257/127; 257/170; 257/347; 257/354; 257/397; 257/409; 257/452; 257/484; 257/620; 257/621; 257/758

(58) Field of Classification Search .............. None
See application file for complete search history.

(56) References Cited

U.S. PATENT DOCUMENTS

| | | | |
|---|---|---|---|
| 5,891,808 A * | 4/1999 | Chang et al. | 438/740 |
| 6,300,666 B1 | 10/2001 | Fechner et al. | |
| 6,412,786 B1 | 7/2002 | Pan | |
| 6,492,716 B1 * | 12/2002 | Bothra et al. | 257/678 |
| 6,521,947 B1 * | 2/2003 | Ajmera et al. | 257/347 |
| 6,537,849 B1 | 3/2003 | Tsai et al. | |
| 6,744,112 B1 * | 6/2004 | Johnson et al. | 257/491 |
| 6,879,023 B1 * | 4/2005 | Gutierrez | 257/547 |
| 2004/0188843 A1 * | 9/2004 | Wakayama et al. | 257/758 |

* cited by examiner

*Primary Examiner*—Andy Huynh
(74) *Attorney, Agent, or Firm*—Slater & Matsil, L.L.P.

(57) ABSTRACT

A substrate contact and semiconductor chip, and methods of forming the same. The substrate contact is employable with a semiconductor chip formed from a semiconductor substrate and includes a seal ring region about a periphery of an integrated circuit region. In one embodiment, the substrate contact includes a contact trench extending through a shallow trench isolation region and an insulator overlying the semiconductor substrate and outside the integrated circuit region. The contact trench is substantially filled with a conductive material thereby allowing the semiconductor substrate to be electrically connected with a metal interconnect within the seal ring region.

36 Claims, 4 Drawing Sheets

SUBSTRATE CONTACT AND METHOD OF FORMING THE SAME

This application claims the benefit of U.S. Provisional Application No. 60/566,187, filed on Apr. 27, 2004, entitled Substrate Contact and Method of Forming the Same, which application is hereby incorporated herein by reference.

TECHNICAL FIELD

The present invention is directed, in general, to semiconductor devices and, more specifically, to a substrate contact and method of forming the same.

BACKGROUND

Semiconductor devices formed on a silicon on insulator ("SOI") substrate include a semiconductor substrate (also referred to as a "substrate") that has a buried insulating layer of oxide that isolates a top layer of silicon (wherein, for instance, active devices are formed) from the underlying substrate. Inasmuch as the portion of the substrate underlying the oxide layer typically is not electrically connected to any other structure (i.e., the underlying substrate is floating), static charges can build up in the substrate during an operation of an integrated circuit constructed thereon. The build up of the static charge may cause a back channel of the semiconductor devices on the silicon on insulator substrate to inadvertently turn on, which can disturb a normal operation of the integrated circuit formed by the semiconductor devices. Several deleterious effects may result from the build up of the static charges including an increase of standby current of the integrated circuit, integrated circuit thermal runaway, and even a malfunction of logic, embedded logic and memory circuits constructed on the silicon on insulator substrate.

To overcome the aforementioned deleterious effects, a contact may be created with the underlying substrate to, in effect, establish a ground connection therefor. One technique to create the contact is to establish a wire bond with an under surface of the integrated circuit at the packaging level. Of course, creating the wire bond connection often requires additional steps and materials in forming the integrated circuit. For example, wire bonding with an under surface of the integrated circuit is typically performed on a circuit by circuit basis thereby leading to a time consuming and expensive process to form an integrated circuit.

Several attempts have been pursued to improve on the wire bonded contacts such as a substrate contact disclosed in U.S. Pat. No. 6,300,666 entitled "Method for Forming a Frontside Contact to the Silicon Substrate of a SOI Wafer in the Presence of Planarized Contact Dielectrics," to Fechner, et al. ("Fechner"), issued Oct. 9, 2001, which is incorporated herein by reference. Fechner discloses a method of forming a substrate contact as part of the normal processing sequence of constructing an integrated circuit without, in this case, exposing a silicon substrate to a gate etch and further employing a local interconnect to raise the substrate contact to a level above a source/drain area prior to depositing a contact dielectric. (Column 2, lines 3–9).

Whereas the substrate contact of Fechner and other references for that matter provide a significant improvement over the wire bonded contacts with the substrate, there are drawbacks associated with the design thereof. First of all, inasmuch as the substrate contacts are formed in an integrated circuit region of a semiconductor die, certain design rules should be followed in designing and constructing the substrate contacts similar to the substrate contact of Fechner. For instance, design rules between a shallow trench isolation region dummy pattern and the substrate contact constructed on the silicon on insulator substrate should be defined and adhered to. The aforementioned design rules should take into account the chemical-mechanical polishing performance of the shallow trench isolation region due to the impact of the substrate contact on the dummy pattern rule. In short, the design rules add another level of complexity in designing and manufacturing the integrated circuit employing the substrate contact, which is not conducive to more efficient and less costly integrated circuit designs and manufacturing processes. Additionally, the designs and processes to form the substrate contacts akin to Fechner may conflict with semiconductor devices such as metal oxide semiconductor transistors and polycrystalline structures within an integrated circuit region of the semiconductor die thereby further complicating the integrated circuit design and related manufacturing processes thereof.

When constructing integrated circuits, in general, a plurality of the integrated circuits are typically constructed simultaneously on a semiconductor wafer or substrate. As described in U.S. Pat. No. 6,412,786, entitled "Die Seal Ring," to Pan, issued on Jul. 2, 2002, which is incorporated herein by reference, scribe lines are often employed between adjacent semiconductor dies (embodying the integrated circuits) of the substrate to facilitate separating the integrated circuits by cutting the substrate along the scribe lines. It is possible, however, to induce lateral stress on the substrate during the process of separating the semiconductor dies, thereby affecting the integrated circuits. One approach for solving such a problem is to form a seal ring (also referred to as a "guard ring") between the scribe line and a peripheral region of the circuitry of the integrated circuit. The stress induced by cutting the substrate is generally obstructed by the seal ring and should not directly impact the integrated circuits embodied in the semiconductor dies located on the substrate.

Seal rings are also employed to provide other benefits in the design and packaging of integrated circuits. For instance, during the design and packaging of the integrated circuits, moisture should be prevented from entering the integrated circuits for a variety of reasons. Moisture can be trapped in oxides and increase the dielectric constant thereof, which affects, for example, metal insulator metal capacitors, gate oxide capacitors, and parasitic interconnect capacitors. Moisture can also create trapped charge centers in gate oxides causing threshold voltage shifts in metal oxide semiconductor transistors embodied in the integrated circuits. Additionally, moisture can create interface states at the silicon and gate oxide interface causing degradation in the transistor lifetime through increased hot electron susceptibility. Moisture can also cause corrosion of metal interconnects, reducing the reliability of the integrated circuit. When trapped in the silicon oxide, moisture reduces the oxide mechanical strength and the oxide becomes more prone to cracking due to tensile stress.

Ionic contaminants can also cause damage to the integrated circuit as the contaminants can diffuse rapidly in the silicon oxide. For instance, ionic contaminants can cause threshold voltage instability in the metal oxide semiconductor transistors, and alter the surface potential of the silicon surface in the vicinity of the ionic contaminants. As described in U.S. Pat. No. 6,492,716, entitled "Seal Ring Structure for IC Containing Integrated Digital/RF/Analog Circuits and Functions," to Bothra, et al., issued on Dec. 10, 2002, which is incorporated herein by reference, a seal ring is often employed to protect the integrated circuit from moisture degradation and ionic contamination.

Additionally, as integrated circuit speeds increase, seal rings have been incorporated into the device encapsulation to reduce radio frequency interference and signal cross coupling. The seal ring is grounded or connected to a signal ground such as a DC supply line to substantially reduce the affects of the interference. The seal ring may be part of the device packaging and a conductive lid may be connected to the seal ring.

Notwithstanding the specific application and the associated benefits associated therewith, seal rings are often employed in the design, construction and packaging of integrated circuits. Inasmuch as the substrate contacts and seal rings employ additional processes and, moreover, valuable real estate to be incorporated into the design and construction of the integrated circuits, it would be advantageous to further integrate substrate contacts and seal rings in the design of the integrated circuits on a semiconductor die.

Accordingly, what is needed in the art is a semiconductor die (also referred to as a "semiconductor chip") and related method of constructing the same that incorporates a substrate contact into the structure of the seal ring that improves upon and overcomes the deficiencies of the prior art. Also, inasmuch as the substrate contacts, in general, induce additional processes and design rules to be incorporated into the integrated circuit region of a semiconductor chip, it would be advantageous to incorporate a substrate contact outside an integrated circuit region, especially in semiconductor chips employing a silicon on insulator substrate.

SUMMARY OF THE INVENTION

These and other problems are generally solved or circumvented, and technical advantages are generally achieved, by advantageous embodiments of the present invention which includes a substrate contract and method of forming the same. The substrate contact is employable with a semiconductor die (also referred to as a "semiconductor chip") formed from a semiconductor substrate (also referred to as a "substrate") and includes a seal ring region about a periphery of an integrated circuit region. In one embodiment, the substrate contact includes a contact trench extending through a shallow trench isolation region and an insulator overlying the substrate and outside the integrated circuit region. The contact trench is substantially filled with a conductive material thereby allowing the substrate to be electrically connected with a metal interconnect within the seal ring region. In another aspect, the present invention provides a method of forming the substrate contact employable with a semiconductor chip on a substrate and outside an integrated circuit region thereof.

In another aspect, the present invention provides a semiconductor chip having a seal ring region including a seal ring with a metal interconnect interleaved with an intermetal dielectric layer about a periphery of an isolation region and an integrated circuit region thereof. In one embodiment, the semiconductor chip includes a silicon on insulator substrate including an underlying substrate, a buried insulating layer overlying the underlying substrate, and an overlying layer of silicon located over portions of the buried insulating layer. The semiconductor chip also includes a substrate contact including a contact trench extending through the buried insulating layer and outside the integrated circuit region. The contact trench is substantially filled with a conductive material thereby allowing the underlying substrate to be electrically connected with the metal interconnect of the seal ring within the seal ring region. In yet another aspect, the present invention provides a method of forming the semiconductor chip including a substrate contact outside an integrated circuit region thereof.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a substrate contact and a method of forming the same, particularly, in the environment of a semiconductor die (also referred to as a "semiconductor chip") employing a silicon on insulator substrate. The principles of the present invention, however, may also be applied to other semiconductor dies and integrated circuits of like construction. The advantages associated with substrate contacts can further be exploited while at the same time reducing the effects of the substrate contact on a design and construction of an integrated circuit region of a semiconductor die.

Figure 1:
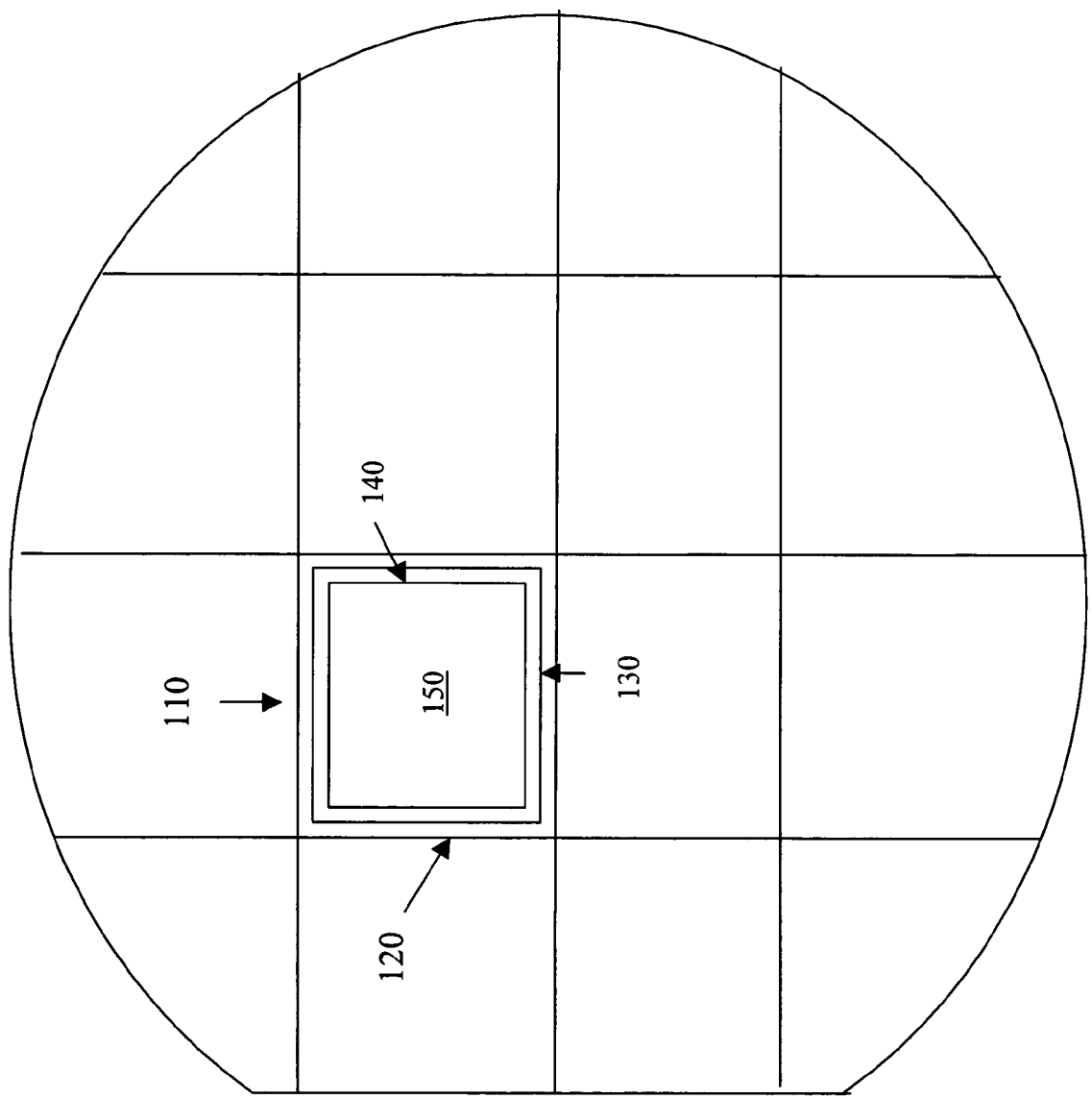
FIG. 1 illustrates a top view of an embodiment of a semiconductor substrate constructed according to the principles of the present invention.

Referring initially to FIG. 1, illustrated is a top view of an embodiment of a semiconductor substrate (also referred to as a "substrate") constructed according to the principles of the present invention. The substrate includes a plurality of semiconductor dies (one of which is designated 110) separable along scribe lines (one of which is designated 120). Within the scribe lines 120 of each semiconductor die 110 is a seal ring region 130 and an isolation region 140 about an integrated circuit region 150.

In conventional semiconductor processes, a plurality of semiconductor dies 110, each of which contains an integrated circuit within the integrated circuit region 150, are typically fabricated on the substrate at substantially the same time. The scribe lines 120 are often employed between adjacent semiconductor dies 110 of the substrate to facilitate separating the integrated circuits by cutting the substrate along the scribe lines 120. It is possible, however, to induce lateral stress on the substrate during the process of separating the semiconductor dies 120 thereby affecting the integrated circuits. One approach for overcoming such a problem is to form a seal ring (within the seal ring region 130) between the scribe lines 120 and the integrated circuit regions of the semiconductor die 110. The stress induced by cutting the substrate is generally obstructed by the seal ring and should not directly impact the integrated circuits embodied in the semiconductor dies 110 located on the substrate.

Figure 2:
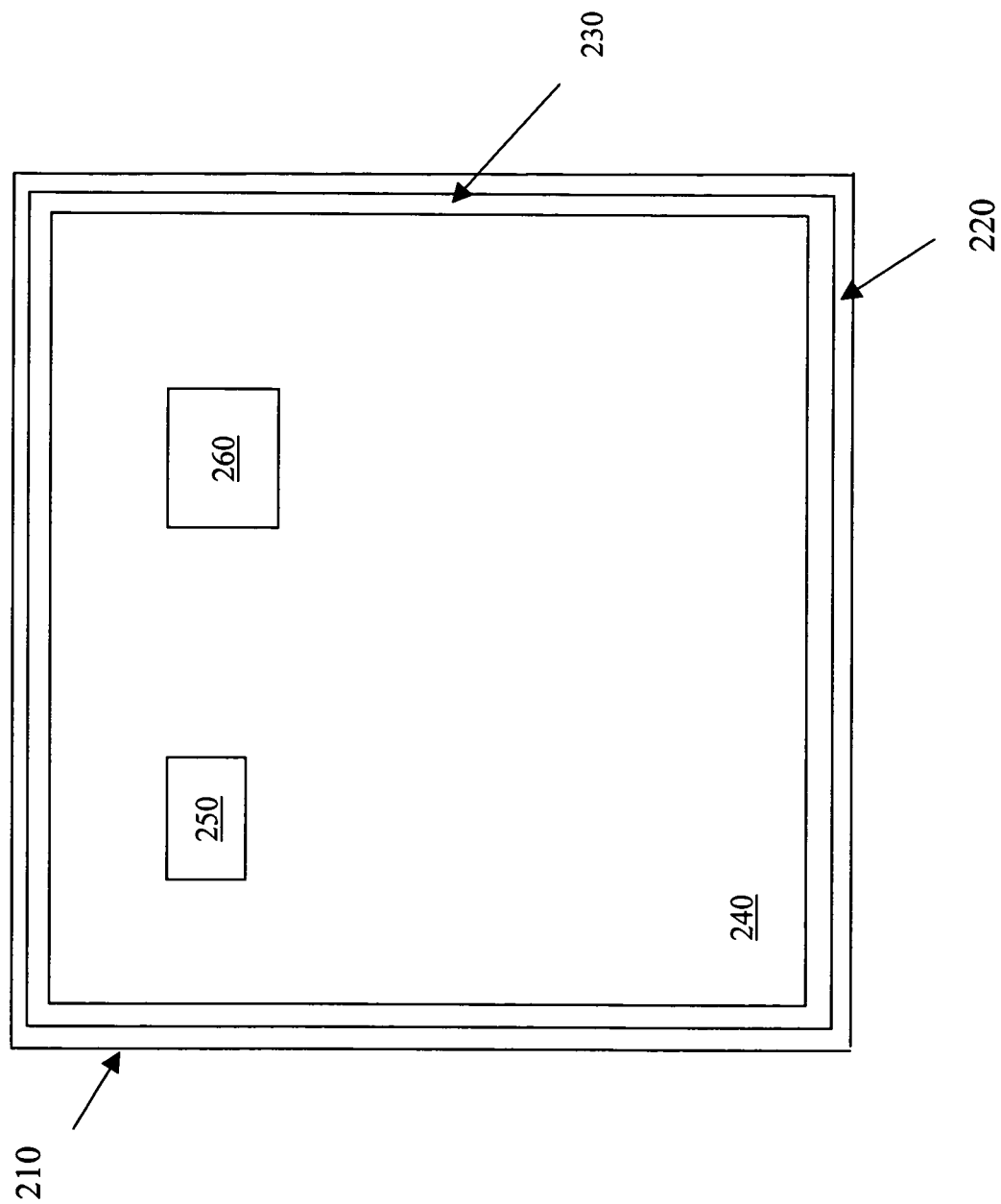
FIG. 2 illustrates a top view of an embodiment of a semiconductor die constructed according to the principles of the present invention.

Turning now to FIG. 2, illustrated is a top view of an embodiment of a semiconductor die constructed according to the principles of the present invention. An outer periphery 210 of the semiconductor die is formed by cutting the substrate along a scribe line as illustrated and described with respect to FIG. 1. A seal ring region 220 and an isolation region 230 are located between the outer periphery 210 of the semiconductor die and an integrated circuit region 240 of the semiconductor die. In other words, the seal ring region 220 is about a periphery of the isolation region 230 and the integrated circuit region 240. Within the integrated circuit region 240 is an integrated circuit (not shown) and a plurality of bond pad regions such as a signal bond pad region 250 and a signal ground bond pad region 260.

A seal ring formed within the seal ring region 220 can perform many beneficial functions for the semiconductor die. As described above, the seal ring can obstruct stress induced by separating adjacent semiconductor dies on a substrate. The seal ring can also protect the integrated circuit within the integrated circuit region 240 from moisture degradation and ionic contamination. In accordance with U.S. Pat. No. 6,537,849, entitled "Seal Ring Structure for Radio Frequency Integrated Circuits," to Tsai, et al., issued Mar. 25, 2003, which is incorporated herein by reference, seal rings have also been incorporated into the semiconductor die to reduce radio frequency interference and signal cross coupling associated with the integrated circuits thereof.

As hereinafter described, the seal ring generally includes a plurality of interleaved metal interconnect layers (i.e., conductive layers) and intermetal dielectric layers and may be continuous about the integrated circuit region 240 as illustrated in the present embodiment or may be partitioned as disclosed in Bothra, et al. and Tsai, et al. Additionally, a substrate contact as described below may be incorporated into the semiconductor die outside of the integrated circuit region 240 such as within the seal ring region 220 or the isolation region 230. For a better understanding of a design and construction of substrate contacts, see U.S. Pat. No. 6,521,947 entitled "Method of Integrating Substrate Contact on SOI Wafers with STI Process," to Ajmera, et al. (Ajmera), issued Feb. 18, 2003, which is incorporated herein by reference.

Figure 3:
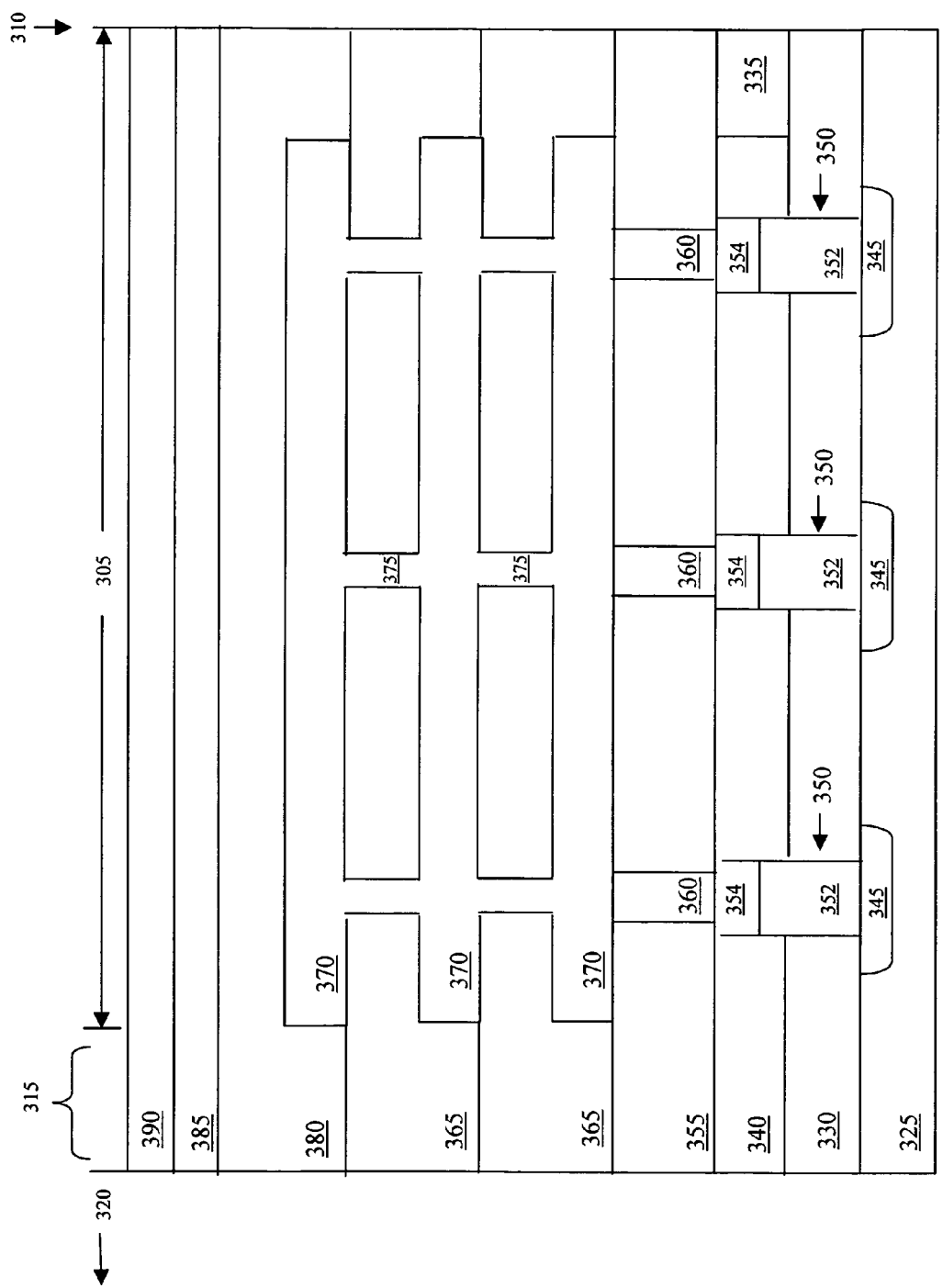
FIG. 3 illustrates a cross sectional view of a portion of a semiconductor die including an embodiment of a substrate contact constructed according to the principles of the present invention.

Turning now to FIG. 3, illustrated is a cross sectional view of a portion of a semiconductor die including an embodiment of a substrate contact constructed according to the principles of the present invention. The portion of the semiconductor die principally illustrated in FIG. 3 is a seal ring region 305 interposed between an outer periphery 310 of the semiconductor die and an isolation region 315 located adjacent an integrated circuit region 320 (wherein an integrated circuit is formed) of the semiconductor die. The semiconductor die is formed from a silicon on insulator substrate including an underlying substrate 325 [e.g., a "substrate" such as a P-type silicon substrate with a surface orientation of (100), (110) or (111), quartz, ceramic or the like], a buried insulating layer 330 (e.g., an "insulator" such as a buried oxide layer of about 3500 angstroms, preferably less than about 5000 angstroms) and an overlying layer of silicon 335 having a thickness of about 1500 angstroms (preferably less than about 3000 angstroms) and located over portions of the buried insulating layer 330. The buried insulating layer 330 and overlying layer of silicon 335 are formed over the underlying substrate 325 employing conventional processes.

A shallow trench isolation region 340 is formed over the buried insulating layer 330 and extends through the isolation region 315 and the seal ring region 305 to the overlying layer of silicon 335. The shallow trench isolation region 340 is formed by using a photoresist mask to define the respective regions therein over the buried insulating layer 330. The shallow trench isolation region 340 is then etched and backfilled with a dielectric such as silicon dioxide, silicon nitride, a combination thereof, or any other suitable dielectric material. A plurality of wells 345 (e.g., P-type wells) are formed within the underlying substrate 325. A photoresist mask defines the lateral areas for an ion implantation process of a dopant specie such as boron to provide the P-type wells 345. Of course, the P-type wells 345 may be formed by other processes in conjunction with, for instance, a creation of a substrate contact as described below or, depending on the application, may be omitted altogether.

A plurality of substrate contacts 350 are then formed within the seal ring region 305 for the underlying substrate 325. To construct the substrate contacts 350, contact trenches 352 are formed and extend through the shallow trench isolation region 340 and the buried insulating layer 330 to the P-type well 345 within the underlying substrate 325. More specifically, a layer of photoresist may be deposited over the seal ring region 305, which is then exposed and developed, resulting in formation of a photoresist mask with an opening for etching the contact trenches 352. Of course, a pattern of the photoresist mask depends upon the structure desired for the contact trenches 352. In accordance with the photoresist mask, an etching process such as a reactive ion etching process is then performed to create the contact trenches 352 having a width of less than one micrometer, and preferably about 0.2 to 0.5 micrometers.

A conductive material is then deposited on the contact trenches 352 to substantially fill the contact trench 352 with the conductive material to form the substrate contacts 350. Any conductive material such as copper, aluminum, tungsten (or the respective alloys), or doped polycrystalline silicon may be employed to allow the substrate contacts 350 to create an electrical connection with the underlying substrate 325. The conductive material may also be an analogous material to the material employed to fill contacts or vias on an interconnect structure employed with an integrated circuit formed within the integrated circuit region 320 of the semiconductor die. Depending on the conductive material employed within the substrate contacts 350, a silicide layer 354 may then be formed over the conductive material to create a low resistance contact for the substrate contact 350. For instance, if the conductive material is a polycrystalline silicon, a layer of metal (e.g., nickel, palladium, platinum or copper) may be deposited over the seal ring region 305 and upon subjecting the semiconductor die to thermal processes (e.g., a rapid thermal annealing process), the layer of metal will react with the polycrystalline silicon to form an electrically conductive silicide layer 354 on a top surface of the substrate contact 350.

An interlevel dielectric layer 355 is thereafter formed over the overlying layer of silicon 335 and the shallow trench isolation region 340 employing conventional processes. Within the interlevel dielectric layer 355 are a plurality of seal ring contacts 360 coupled to a respective substrate contact 350. The seal ring contacts 360 may be formed of a like conductive material and in a manner analogous to the substrate contacts 350. The seal rings contacts 360 are coupled to a seal ring including a plurality of interleaved metal interconnect layers (generally designated 370) and intermetal dielectric layers (generally designated 365). The intermetal interconnect layers 370 (preferably with a metal sheet resistance less than about 20 ohms per square) are electrically connected through a plurality of vias (generally designated 375) preferably formed of the same conductive material as the metal interconnect layers 370. Those skilled in the art should understand that any conductive material may be employed for the metal interconnect layers 370 and still be within the broad scope of the present invention. In conjunction therewith, it should be understood that the various conductive layers within the semiconductor die may employ analogous or different materials and still be within the broad scope of the present invention. For instance, the conductive material employed with the plurality of vias 375 may be different from the conductive material employed with the contact trenches 352. Additionally, while the intermetal dielectric layers 365 extend into the isolation region 315, the metal interconnect layers 370 are constrained to the seal ring region 305 in the present embodiment. It should also be understood that any suitable dielectric material may be employed for the interlevel and intermetal dielectric layers 355, 370 (preferably with a dielectric constant less than about eight).

By virtue of the substrate contacts 350, the underlying substrate 325 is electrically connected with the metal interconnect layers 370 (also referred to as "metal interconnect (s)") within the seal ring region 305. In the present embodiment, the substrate contacts 350 are electrically connected with the metal interconnect layers 370 via a P-type well 345 within the underlying substrate 325 and a seal ring contact 360 formed in the interlevel dielectric layer 355 (a "dielectric layer") and located between the substrate contacts 350 and the metal interconnect layers 370. As a result, the substrate contacts 350 create a contact with the underlying substrate 325 to, in effect, establish a ground connection therefor and combat the deleterious effects as described above that may result from the potential build up of static charges in the underlying substrate 325.

A passivation layer 380 is then formed above an upper level of the intermetal dielectric layers 365 and about an upper level of the metal interconnect layers 370. The passivation layer 380 extends within the seal ring region 305 and the isolation region 315 and may be composed of an oxide deposited by a chemical vapor deposition process having a thickness of between about 4,000 and 20,000 angstroms. A nitride layer 385 composed of, for instance, silicon nitride is conformally deposited by a chemical vapor deposition process to a thickness of between about 1,000 and 10,000 angstroms over the passivation layer 380. The chemical vapor deposition processes provide fine step coverage along the outer periphery 310 of the semiconductor die. A polyimide layer 390 is then deposited by, for instance, spin-on techniques to a thickness of between about two micrometers to six micrometers over the nitride layer 385. Analogous to the passivation layer 380, the nitride and polyimide layers 385, 390 extend within the seal ring region 305 and the isolation region 315. By way of example, a typical width of the seal ring region 305 is between 0.1 and fifteen micrometers and a typical width of the isolation region 315 is between one and two micrometers.

Figure 4:
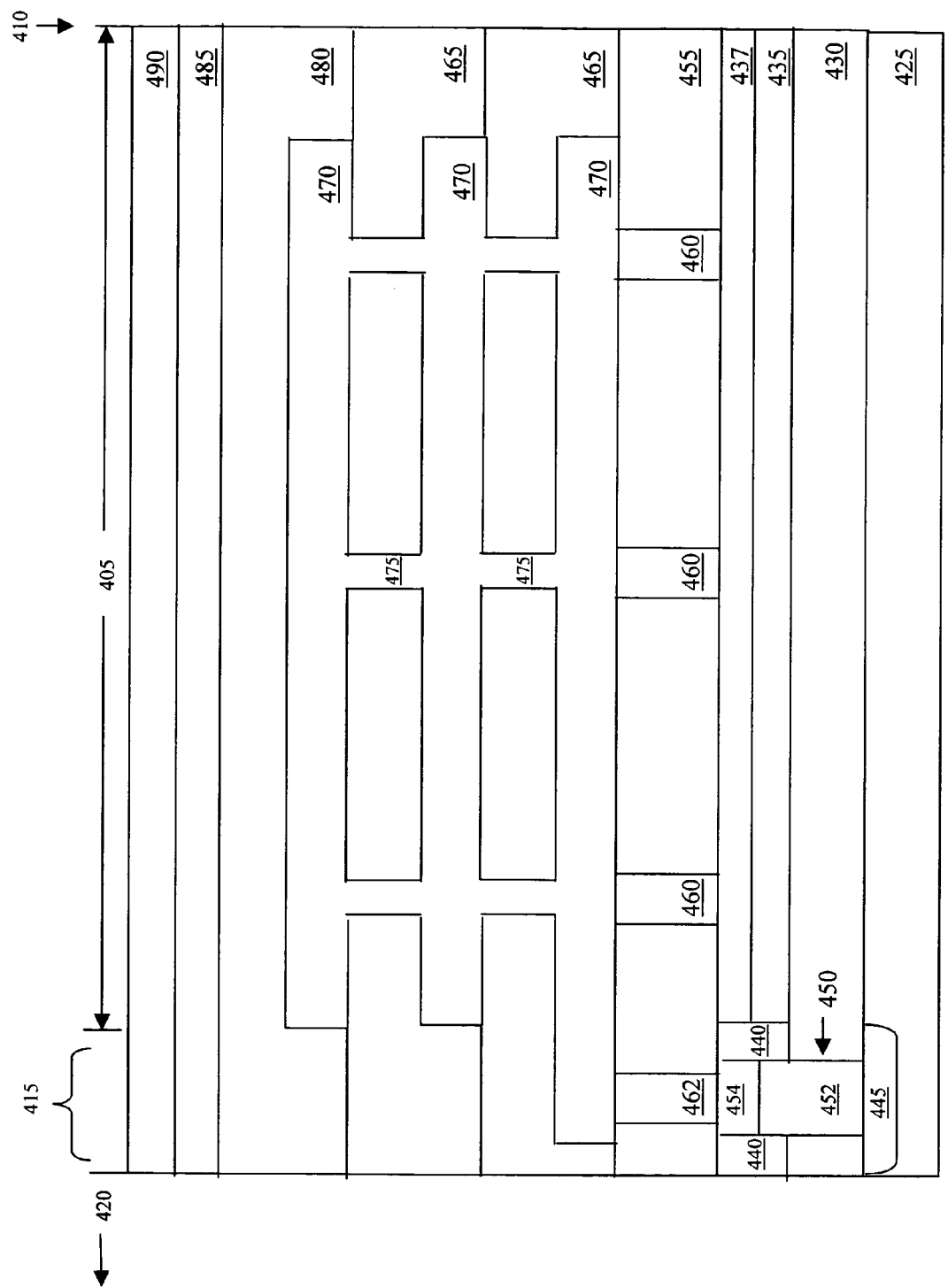
FIG. 4 illustrates a cross sectional view of a portion of a semiconductor die including another embodiment of a substrate contact constructed according to the principles of the present invention.

Turning now to FIG. 4, illustrated is a cross sectional view of a portion of a semiconductor die including another embodiment of a substrate contact constructed according to the principles of the present invention. The portion of the semiconductor die principally illustrated in FIG. 4 is a seal ring region 405 interposed between an outer periphery 410 of the semiconductor die and an isolation region 415 located adjacent an integrated circuit region 420 (wherein an integrated circuit is formed) of the semiconductor die. The semiconductor die is formed from a silicon on insulator substrate including an underlying substrate 425 [e.g., a "substrate" such as a P-type silicon substrate with a surface orientation of (100), (110) or (111), quartz, ceramic or the like], a buried insulating layer 430 (e.g., an "insulator" such as a buried oxide layer of about 3500 angstroms, preferably less than about 5000 angstroms) and an overlying layer of silicon 435 having a thickness of about 1500 angstroms (preferably less than about 3000 angstroms) and located over portions of the buried insulating layer 430. The buried insulating layer 430 and overlying layer of silicon 435 are formed over the underlying substrate 425 employing conventional processes.

A shallow trench isolation region 440 is formed over the buried insulating layer 430 and extends through the isolation region 415 to the overlying layer of silicon 435 within the seal ring region 405. The shallow trench isolation region 440 is formed by using a photoresist mask to define the respective regions therein over the buried insulating layer 430. The shallow trench isolation region 440 is then etched and backfilled with a dielectric such as silicon dioxide, silicon nitride, a combination thereof, or any other suitable dielectric material. A well 445 (e.g., P-type well) is formed within the underlying substrate 425. A photoresist mask defines the lateral area for an ion implantation process of a dopant specie such as boron to provide the P-type well 445. Of course, the P-type well 445 may be formed by other processes in conjunction with, for instance, a creation of a substrate contact as described below or, depending on the application, may be omitted altogether.

A substrate contact 450 is then formed within the isolation region 415 for the underlying substrate 425. To construct the substrate contact 450, a contact trench 452 is formed and extends through the shallow trench isolation region 440 and the buried insulating layer 430 to the P-type well 445 within the underlying substrate 425. More specifically, a layer of photoresist may be deposited over the isolation region 415, which is then exposed and developed, resulting in formation of a photoresist mask with an opening for etching the contact trench 452. Of course, a pattern of the photoresist mask depends upon the structure desired for the contact trench 452. In accordance with the photoresist mask, an etching process such as a reactive ion etching process is then performed to create the contact trench 452 having a width of less than one micrometer, and preferably about 0.2 to 0.5 micrometers.

A conductive material is then deposited on the contact trench 452 to substantially fill the contact trench 452 with the conductive material to form the substrate contact 450. Any conductive material such as copper, aluminum, tungsten (or the respective alloys), or doped polycrystalline silicon may be employed to allow the substrate contact 450 to create an electrical connection with the underlying substrate 425. The conductive material may also be an analogous material to the material employed to fill contacts or vias on an interconnect structure employed with an integrated circuit formed within the integrated circuit region 420 of the semiconductor die. Depending on the conductive material employed within the substrate contact 450, a substrate contact silicide layer 454 (a "silicide layer") may then be formed over the conductive material to create a low resistance contact for the substrate contact 450. For instance, if the conductive material is a polycrystalline silicon, a layer of metal (e.g., nickel, palladium, platinum or copper) may be deposited over the isolation region 415 and upon subjecting the semiconductor die to thermal processes (e.g., a rapid thermal annealing process), the layer of metal will react with the polycrystalline silicon to form an electrically conductive substrate contact silicide layer 454 on a top surface of the substrate contact 450. Additionally, employing analogous construction techniques to the substrate contact silicide layer 454, another silicide layer (e.g., a seal ring silicide layer) 437 is formed over and provides a low resistance contact for the overlying layer of silicon 435 within the seal ring region 405.

An interlevel dielectric layer 455 is thereafter formed over the seal ring silicide layer 437 and the shallow trench isolation region 440 employing conventional processes. Within the interlevel dielectric layer 455 are a plurality of seal ring contacts 460 and an isolation region contact 462 coupled to the substrate contact 450. The seal ring contacts 460 and isolation region contact 462 may be formed of a like conductive material and in a manner analogous to the substrate contact 450. The seal ring contacts 460 and the isolation region contact 462 are coupled to a seal ring including a plurality of interleaved metal interconnect layers (generally designated 470) and intermetal dielectric layers (generally designated 465). The metal interconnect layers 470 (preferably with a metal sheet resistance less than about 20 ohms per square) are electrically connected through a plurality of vias (generally designated 475) preferably formed of the same conductive material as the metal interconnect layers 470. Those skilled in the art should understand that any conductive material may be employed for the metal interconnect layers 470 and still be within the broad scope of the present invention. In conjunction therewith, it should be understood that the various conductive layers within the semiconductor die may employ analogous or different materials and still be within the broad scope of the present invention. Additionally, while the intermetal dielectric layers 465 extend into the isolation region 415, only a lower level of the metal interconnect layers 470 extends into the isolation region 415 in the present embodiment. It should also be understood that any suitable dielectric material may be employed for the interlevel and intermetal dielectric layers 455, 470 (preferably with a dielectric constant less than about eight).

By virtue of the substrate contact 450, the underlying substrate 425 is electrically connected with a lower level of the metal interconnect layers 470 (also referred to as "metal interconnect(s)") within the isolation region 415 and, ultimately, the plurality of metal interconnect layers 470 within the seal ring region 405. In the present embodiment, the substrate contact 450 is electrically connected with the metal interconnect layers 470 via a P-type well 445 within the underlying substrate 425 and an isolation region contact 462 formed in the interlevel dielectric layer 455 (a "dielectric layer") and located between the substrate contact 450 and the lower level of the metal interconnect layers 470. As a result, the substrate contact 450 creates a contact with the underlying substrate 425 to, in effect, establish a ground connection therefor and combat the deleterious effects as described above that may result from the potential build up of static charges in the underlying substrate 425.

A passivation layer 480 is then formed above an upper level of the intermetal dielectric layers 465 and about an upper level of the metal interconnect layers 470. The passivation layer 480 extends within the seal ring region 405 and the isolation region 415 and may be composed of an oxide deposited by a chemical vapor deposition process having a thickness of between about 4,000 and 20,000 angstroms. A nitride layer 485 composed of, for instance, silicon nitride is conformally deposited by a chemical vapor deposition process to a thickness of between about 1,000 and 10,000 angstroms over the passivation layer 480. The chemical vapor deposition processes provide fine step coverage along the outer periphery 410 of the semiconductor die. A polyimide layer 490 is then deposited by, for instance, spin-on techniques to a thickness of between about two micrometers to six micrometers over the nitride layer 485. Analogous to the passivation layer 480, the nitride and polyimide layers 485, 490 extend within the seal ring region 405 and the isolation region 415. By way of example, a typical width of the seal ring region 405 is between 0.1 and fifteen micrometers and a typical width of the isolation region 415 is between one and two micrometers.

Thus, a substrate contact and method of forming the same with readily attainable and quantifiable advantages has been introduced. Those skilled in the art should understand that the previously described embodiments of the substrate contact and related method of forming the same are submitted for illustrative purposes only and that other embodiments capable of providing a substrate contact outside an integrated circuit region of a semiconductor die or chip are well within the broad scope of the present invention. As a result, incorporating a substrate contact constructed according to the principles of the present invention into an integrated circuit does not over complicate the design and manufacture thereof, which is conducive to more efficient and less costly integrated circuit designs and manufacturing processes.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. For use with a semiconductor chip formed from a substrate and including a seal ring region about a periphery of an integrated circuit region, a substrate contact comprising a contact trench formed within said seal ring region and extending through a shallow trench isolation region and an insulator overlying said substrate and outside said integrated circuit region, said contact trench being substantially filled with a conductive material thereby allowing said substrate to be electrically connected with a metal interconnect within said seal ring region; wherein said substrate contact is coupled to a seal ring contact formed in a dielectric layer between said substrate contact and said metal interconnect.

2. The substrate contact as recited in claim 1 wherein said contact trench is formed within an isolation region.

3. The substrate contact as recited in claim 2 wherein said isolation region is interposed between said seal, ring region and said integrated circuit region, said substrate contact being coupled to an isolation region contact formed in a dielectric layer between said substrate contact and said metal interconnect.

4. The substrate contact as recited in claim 1 further comprising a silicide layer on a top surface thereof.

5. The substrate contact as recited in claim 1 wherein said substrate contact is electrically connected with said metal interconnect via a well within said substrate.

6. For use with a semiconductor chip formed from a substrate and including a seal ring region about a periphery of an integrated circuit region, a method of forming a substrate contact, comprising:
    forming a contact trench within said seal region and through a shallow trench isolation region and an insulator overlying said substrate and outside said integrated circuit region; and
    depositing a conductive material within said contact trench thereby allowing said substrate to be electrically connected with a metal interconnect within said seal ring region; wherein said substrate contact is coupled to a seal ring contact formed in a dielectric layer between said substrate contact and said metal interconnect.

7. The method as recited in claim 6 wherein said contact trench is formed within an isolation region.

8. The method as recited in claim 7 wherein said isolation region is interposed between said seal ring region and said integrated circuit region, said substrate contact being coupled to an isolation region contact formed in a dielectric layer between said substrate contact and said metal interconnect.

9. The method as recited in claim 6 further comprising forming a silicide layer on a top surface of said substrate contact.

10. The method as recited in claim 6 wherein said substrate contact is electrically connected with said metal interconnect via a well within said substrate.

11. A semiconductor chip having a seal ring region including a seal ring with a metal interconnect interleaved with an intermetal dielectric layer about a periphery of an isolation region and an integrated circuit region thereof, comprising:
    a silicon on insulator substrate, including:
        an underlying substrate,
        a buried insulating layer overlying said underlying substrate, and
        an overlying layer of silicon located over portions of said buried insulating layer; and
    a substrate contact including a contact trench extending through said buried insulating layer and outside said integrated circuit region, said contact trench being substantially filled with a conductive material; wherein said underlying substrate is electrically connected with said metal interconnect of said seal ring within said seal ring region.

12. The semiconductor chip as recited in claim 11 wherein said contact trench is formed within said seal ring region.

13. The semiconductor chip as recited in claim 12 wherein said substrate contact is coupled to a seal ring contact formed in an interlevel dielectric layer between said substrate contact and said metal interconnect.

14. The semiconductor chip as recited in claim 11 wherein said contact trench is formed within said isolation region.

15. The semiconductor chip as recited in claim 18 wherein said isolation region is interposed between said seal ring region and said integrated circuit region, said substrate contact being coupled to an isolation region contact formed in an interlevel dielectric layer between said substrate contact and said metal interconnect.

16. The semiconductor chip as recited in claim 11 wherein said substrate contact further includes a silicide layer on a top surface thereof.

17. The semiconductor chip as recited in claim 11 wherein said contact trench extends through a shallow trench isolation region over said buried insulating layer, said substrate contact being electrically connected with said metal interconnect via a well within said underlying substrate.

18. The semiconductor chip as recited in claim 11 wherein said underlying substrate has a surface orientation selected from the group consisting of:
    (100),
    (110), and
    (111).

19. The semiconductor chip as recited in claim 11 wherein said buried insulating layer is a buried oxide layer.

20. The semiconductor chip as recited in claim 11 wherein said seal ring includes a plurality of metal interconnects.

21. The semiconductor chip as recited in claim 11 wherein said seal ring includes a plurality of intermetal dielectric layers.

22. The semiconductor chip as recited in claim 11 wherein said buried insulating layer has a thickness less than about 5000 angstroms.

23. The semiconductor chip as recited in claim 11 wherein said overlying layer of silicon has a thickness less than about 3000 angstroms.

24. The semiconductor chip as recited in claim 11 wherein said seal ring includes at least one via formed of a conductive material different from said conductive material employed with said contact trench.

25. A method of forming a semiconductor chip, comprising:
    forming a silicon on insulator substrate, including:
        proving an underlying substrate,
        forming a buried insulating layer over said underlying substrate, and
        forming an overlying layer of silicon over portions of said buried insulating layer;
    forming an integrated circuit over said silicon on insulator substrate within an integrated circuit region;
    forming a substrate contact, including:

forming a contact trench through said buried insulating layer and outside said integrated circuit region, and depositing a conductive material within said contact trench;

forming a seal ring including a metal interconnect interleaved with an intermetal dielectric layer within a seal ring region about a periphery of said integrated circuit region, said substrate contact; wherein said underlying substrate is electrically connected with said metal interconnect of said seal ring within said seal ring region.

26. The method as recited in claim 25 wherein said contact trench is formed within said seal ring region.

27. The method as recited in claim 26 wherein said substrate contact is coupled to a seal ring contact formed in an interlevel dielectric layer between said substrate contact and said metal interconnect.

28. The method as recited in claim 25 wherein said contact trench is formed within an isolation region.

29. The method as recited in claim 28 wherein said isolation region is interposed between said seal ring region and said integrated circuit region, said substrate contact being coupled to an isolation region contact formed in an interlevel dielectric layer between said substrate contact and said metal interconnect.

30. The method as recited in claim 25 wherein forming said substrate contact further includes forming a suicide layer on a top surface of said substrate contact.

31. The method as recited in claim 25 wherein said contact trench extends through a shallow trench isolation region over said buried insulating layer, said substrate contact being electrically connected with said metal interconnect via a well within, said underlying substrate.

32. The method as recited in claim 25 wherein said underlying substrate has a surface orientation selected from the group consisting of:

(100), (110), and (111).

33. The method as recited in claim 25 wherein said buried insulating layer is a buried oxide layer.

34. The method as recited in claim 25 wherein said seal ring includes a plurality of metal interconnects interleaved with a plurality of intermetal dielectric layers.

35. The method as recited in claim 25 wherein said buried insulating layer has a thickness less than about 5000 angstroms and said overlying layer of silicon has a thickness less than about 3000 angstroms.

36. The method as recited in claim 25 wherein said seal ring includes at least one via fanned of a conductive material different from said conductive material employed with said contact trench.

* * * * *